(12) United States Patent
Prodic et al.

(10) Patent No.: US 8,081,041 B2
(45) Date of Patent: Dec. 20, 2011

(54) GLUE-LOGIC BASED METHOD AND SYSTEM FOR MINIMIZING LOSSES IN OVERSAMPLED DIGITALLY CONTROLLED DC-DC CONVERTERS

(75) Inventors: Aleksandar Prodic, Toronto (CA); Zdravko Lukic, Toronto (CA); Aleksandar Radic, New Westminster (CA)

(73) Assignee: Exar Corporation, Fremont, CA (US)

( * ) Notice: Subject to any disclaimer, the term of this patent is extended or adjusted under 35 U.S.C. 154(b) by 156 days.

(21) Appl. No.: 12/708,845

(22) Filed: Feb. 19, 2010

(65) Prior Publication Data

US 2011/0204988 A1 Aug. 25, 2011

(51) Int. Cl.
*H02M 3/335* (2006.01)
*H03K 7/08* (2006.01)
(52) U.S. Cl. ....... 332/109; 327/172; 327/176; 363/21.1; 363/21.11
(58) Field of Classification Search .......... 332/109–111; 327/172–177; 363/21.1, 21.11, 26, 41
See application file for complete search history.

(56) References Cited

U.S. PATENT DOCUMENTS

| | | | |
|---|---|---|---|
| 6,639,391 B2 | 10/2003 | Huang et al. | |
| 7,923,980 B2 * | 4/2011 | Takahashi et al. | 323/283 |
| 2004/0046456 A1 | 3/2004 | Tracy et al. | |
| 2006/0012351 A1 | 1/2006 | Moussaoui et al. | |
| 2006/0062291 A1 | 3/2006 | Marotta et al. | |
| 2006/0181256 A1 | 8/2006 | Nagai | |
| 2009/0212751 A1 | 8/2009 | Cervera et al. | |

OTHER PUBLICATIONS

International Searching Authority, International Search Report and Written Opinion, Apr. 14, 2011, 7 pages, (PCT/US11/25324).
Zhao, et al., "Continuous-Time Digital Controller for High-Frequency DC-DC Converters", IEEE Transactions on Power Electronics, Mar. 2008, pp. 564-573, vol. 23, No. 2.
Erickson, et al., "Fundamentals of Power Electronics", 2001, p. 18, Springer+Business Media, Inc.
"FDMF8700 Data Sheet. Driver Plus FET Multi-chip Module", Mar. 2007, 13 pages, Fairchild Semiconductors.
"PIP212-12M Data Sheet. DC-to_DC Converter Powertrain", Oct. 23, 2006, 21 pages, NXP Semiconductors.
"AN10348. PIP212-12M Design Guide. Application Notes", Apr. 27, 2007. 22 pages, NXP Semiconductors.
Cheng, et al., "A High-Accuracy and High-Efficiency on-Chip Current Sensing for Current-Mode Control CMOS DC-DC Buck Converter", 2008, pp. 458-461, IEEE, 15th International Electronics, Circuits and Systems Conference.
Duan, et al. "Current-Mode Variable-Frequency Control Architecture for High-Current Low-Voltage DC-DC Converters", Jul. 2006, pp. 1133-1137, IEEE Transactions on Power Electronics, vol. 21, Issue 1.
Miller, "A Voltage Regulator Module (VRM) Using the HIP6004 PWM Controller (HIP6004EVAL1)", Jan. 1997, 7 pages, Intersil Corporation.

(Continued)

*Primary Examiner* — David Mis
(74) *Attorney, Agent, or Firm* — Fliesler Meyer LLP (57) ABSTRACT

A practical method and system for oversampled digitally controlled DC-DC converters is presented. To minimize the switching losses while maintaining all advantages of the oversampling, "glue logic" and application specific oversampling digital pulse-width modulator are introduced. Experimental results demonstrate transient response with 50% smaller deviation than that of conventional controllers, allowing for proportional reduction in the size of the power stage output capacitor.

16 Claims, 8 Drawing Sheets

OTHER PUBLICATIONS

Corradini, et al., "Digital Hysteretic Voltage-Mode Control for DC-DC Converters Based on Asynchronous Sampling", Jan. 2009, pp. 201-211, IEEE Transactions on Power Electronics, vol. 24.

Effler, et al., "Digital Control Law Using a Novel Load Current Estimator Principle for Improved Transient Response", 2008, pp. 4585-4589, Proceedings IEEE Power Electronics Specialist Conference.

Corradini, et al., "Time Optimal, Parameters-Insensitive Digital Controller for VRM Applications with Adaptive Voltage Positioning", 2008, 8 pages, Proceedings IEEE Workshop on Computers in Power Electronics.

Costabeber, et al., "Time Optimal, Parameters-insensitive Digital Controller for DC-DC Buck Converters", 2008, pp. 1243-1249, Proceedings IEEE Power Electronics Specialist Conference.

Yousefzadeh, et al., "Proximate Time-Optimal Digital Control for Synchronous Buck DC-DC Converters", Jul. 2007, pp. 2018-2026, IEEE Transactions on Power Electronics, vol. 23, No. 4.

Feng, et al. "A New Digital Control Algorithm to Achieve Optimal Dynamic Performance in DC-to-DC Converters", Jul. 2007, pp. 1489-1498, IEEE Transactions on Power Electronics, vol. 22, No. 4.

Corradini, et al., "High-Bandwidth Multisampled Digitally Controlled DC-DC Converters Using Ripple Compensation", Apr. 2008, pp. 1501-1508, IEEE Transactions on Industrial Electronics, Vol. 55, No. 4.

Hu, et al., "Nonuniform A/D Quantization for Improved Dynamic Responses of Digitally Controlled DC-DC Converters", Jul. 2008, pp. 1998-2005, IEEE Transactions on Power Electronics, vol. 23, No. 4.

Parayandeh, et al., "Programmable Analog-to-Digital Converter for Low-Power DC-DC SMPS", Jan. 2008, pp. 500-505, IEEE Transactions on Power Electronics, vol. 23, No. 1.

Lukic, et al., "Multibit Σ-Δ PWM Digital Controller IC for DC-DC Converters Operating at Switching Frequencies Beyond 10 MHz", Sep. 2007, pp. 1693-1707, IEEE Transactions on Power Electronics, vol. 22, No. 5.

Peterchev, et al., "Architecture and IC Implementation of a Digital VRM Controller", Jan. 2003, IEEE Transactions on Power Electronics, vol. 18, No. 1, (pp. 356-364).

Xiao, "A 4-μA Quiescent-Current Dual-Mode Digitally Controlled Buck Converter IC for Cellular Phone Applications", Dec. 2004, pp. 2342-2348, IEEE Journal of Solid-State Circuits, vol. 39, No. 12.

Patella, et al., "High-Frequency Digital PWM Controller IC for DC-DC Converters", Jan. 2003, pp. 438-446, IEEE Transactions on Power Electronics, vol. 18, No. 1.

* cited by examiner

GLUE-LOGIC BASED METHOD AND SYSTEM FOR MINIMIZING LOSSES IN OVERSAMPLED DIGITALLY CONTROLLED DC-DC CONVERTERS

FIELD OF THE INVENTION

The present invention relates to digital pulse width modulators (DPWM) and digitally controlled switched mode power supplies (SMPS).

BACKGROUND

Digital pulse width modulators (DPWM) are used to generate a pulse width modulation (PWM) signal for creating a DC output in DC-DC converters. The duty cycle (percentage of time high) of the PWM signal is used to set the DC output voltage.

The PWM signal is sent to external switches that send an input voltage into an LC circuit, which includes an inductor and an output capacitor, to produce the output voltage. The output voltage is used to create a feedback signal. The feedback signal is used to adjust the PWM signal so as to keep the output voltage at the desired DC output voltage value.

Digital controllers for DC-DC converters usually regulate the output voltage by taking the samples produced by an analog-to-digital converter (ADC). To improve the converter efficiency, minimize the power consumption of the controller circuit and reduce the hardware complexity, the ADC and accompanying digital pulse-width modulator usually updates their values once per switching cycle. Previously, several such low-power, high-frequency digital controller IC implementations were presented. However, compared to analog IC controllers, the dynamic response of those is usually inferior, negatively affecting the size of the power stage components, especially the output capacitor.

Recent linear and non-linear digital controllers have demonstrated that oversampling of the output voltage results in significant response improvements and reduction of power stage components. However, such solutions usually introduce significant switching losses. As a result, for frequent load changes, the converter efficiency is lower compared to conventional implementations.

SUMMARY OF THE INVENTION

As discussed above, one way to deal with the problem of rapid output voltage deviations is to produce delta pulses in the PWM signal output. For example, the feedback signal can be oversampled at a high frequency that is a multiple of the normal PWM signal frequency. Extra pulses can be added to the PWM signal at the higher frequency to quickly adjust the output voltage back to the desired value.

The downside of this method is that the switching of the external switches at the higher frequency results in much greater power consumption and may result in overheating of the external switches.

The following describes an oversampling method and system which achieves significant output voltage transient improvements compared to conventional proportional-integral-derivative (PID) based controllers using a very modest increase in oversampling rate and the minimum number of additional switching actions of the power transistors. During transients, the controller calculates changes of the duty ratio at a higher rate than the switching frequency. Then, the values are "glued" with the oversampled DPWM. As a result, the switching frequency is not significantly increased, but yet the effect of oversampling is fully utilized.

By "gluing" together the extra pulses determined by the oversampling, the frequency of the PWM output signal can be kept below the frequency of the oversampling while still giving a fast response to the output voltage deviation.

A pulse glue generator can be used to create the additional pulses so that the frequency of PWM output is kept below the oversampling frequency. For example, oversampling can be done at four times the normal PWM signal frequency, with the additional pulses being arranged such that the modified PWM signal frequency during the output voltage deviation is limited to twice the normal PWM signal frequency.

BRIEF DESCRIPTION OF THE DRAWINGS

FIGS. 2A-B illustrate the operation of the oversampled digital controller during a transient; FIG. 2A showing multiple control actions based on successive load-change estimation; FIG. 2B showing control actions "glued" to limit switching activity during transients to $2f_{sw}$.

FIGS. 6A-B show the oversampled controller IC; FIG. 6A shows an exemplary chip die.

FIGS. 7A-B show a controller response to a 30-A load step; FIG. 7A shows a conventional controller.

DETAILED DESCRIPTION OF THE INVENTION

A digital pulse width modulator (DPWM) 102 normally produces a pulse width modulation (PWM) output signal at a first frequency in pulses per second. The DPWM 102 oversamples a feedback signal at a second frequency greater than the first frequency. During output voltage deviations, the DPWM produces a modified PWM signal using the oversampled feedback signal. The modified PWM signal being limited to not exceed a third frequency that is between the first and second frequency.

In one embodiment, the oversampling is done at four times the first frequency and the third frequency is twice the first frequency. Other oversampling and modified PWM signal frequencies can be used, as well. For example, the oversampling can be done at a frequency eight times the normal PWM signal frequency with the modified PWM signal frequency being at two or four times the normal PWM signal frequency. In one embodiment, the third frequency is limited to half the oversampling frequency.

Figure 1:
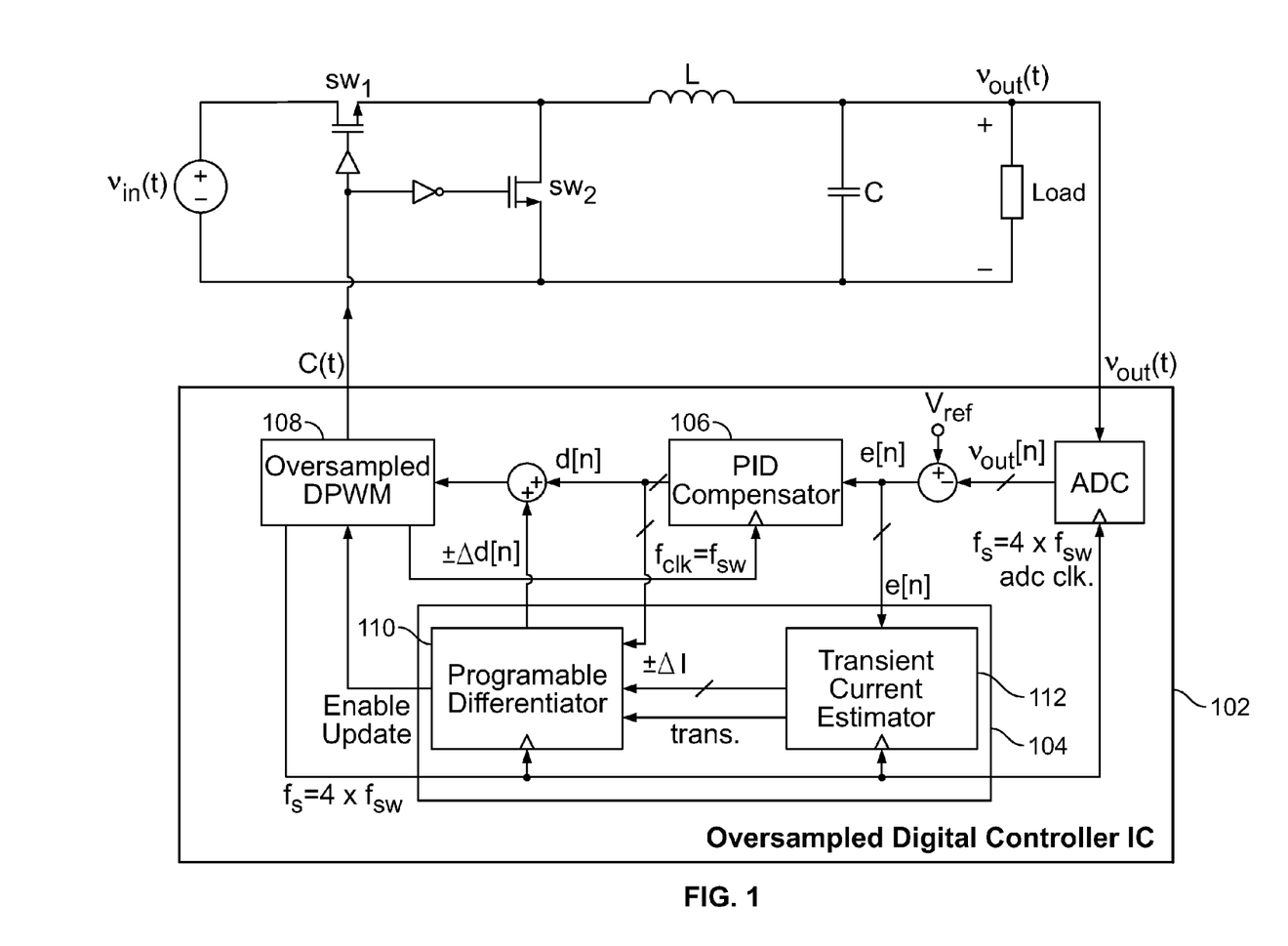
FIG. 1 illustrates an oversampled digital controller integrated circuit (IC) regulating the operation of power stage (in this case a buck converter).

Block 104 is used to determine the output voltage deviation and to create the $\Delta d[n]$ values at the second frequency. The PID compensator 106 operates at the first frequency to produce the normal duty cycle signal d[n].

Figure 5:
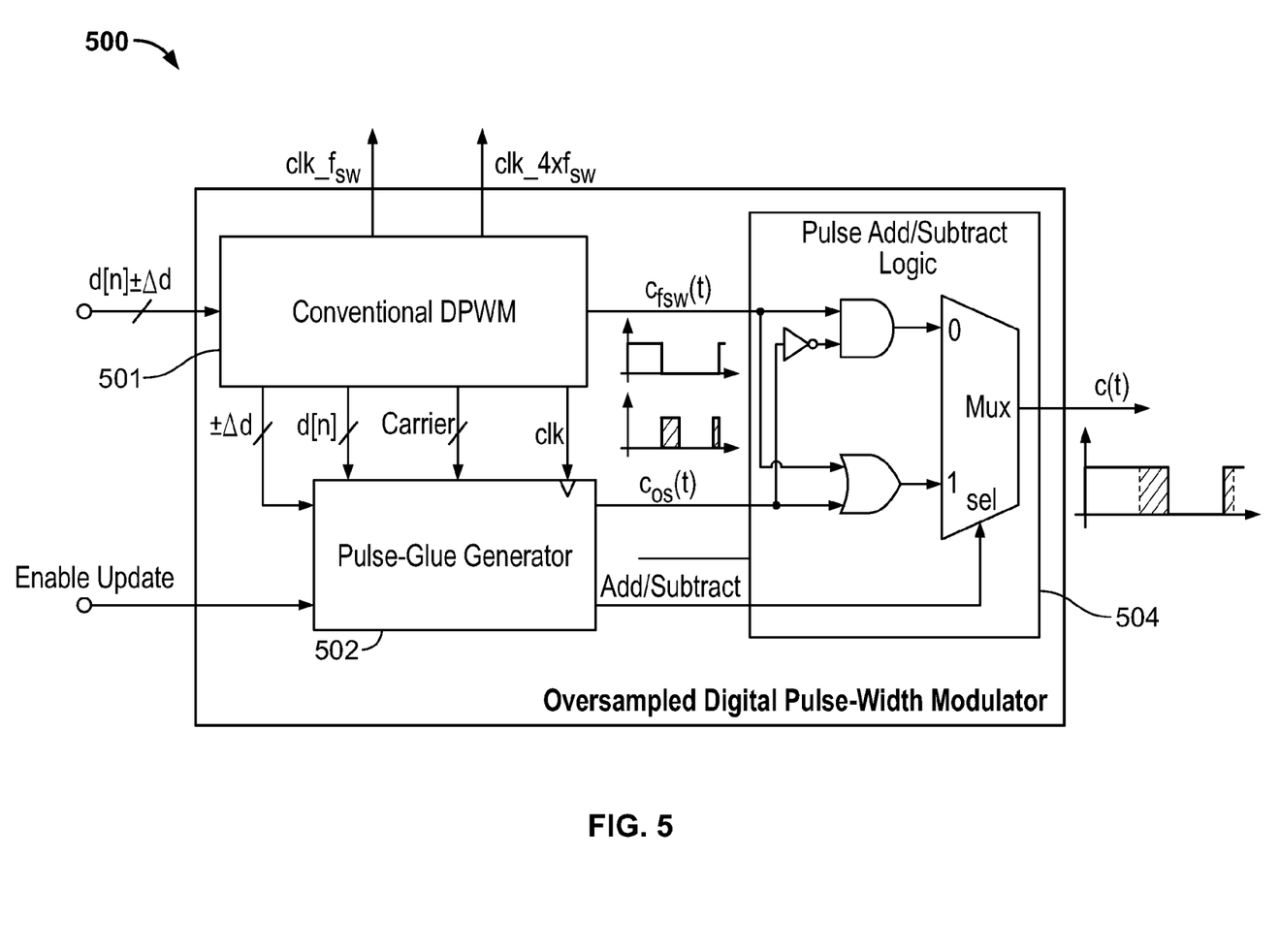
FIG. 5 is block diagram of the oversampled digital pulse-width modulator.

The oversampled DPWM block 108 is used to create the PWM signal. As shown in FIG. 5, the oversampled DPWM block 500 creates additional pulses to create a modified PWM signal. A pulse glue generator 502 produces a signal to be added or subtracted to the normal PWM signal during output voltage deviations. The pulses for the pulse glue generator 502 are added or subtracted to the normal PWM signal with pulse add/subtract logic 504.

Figure 2A:
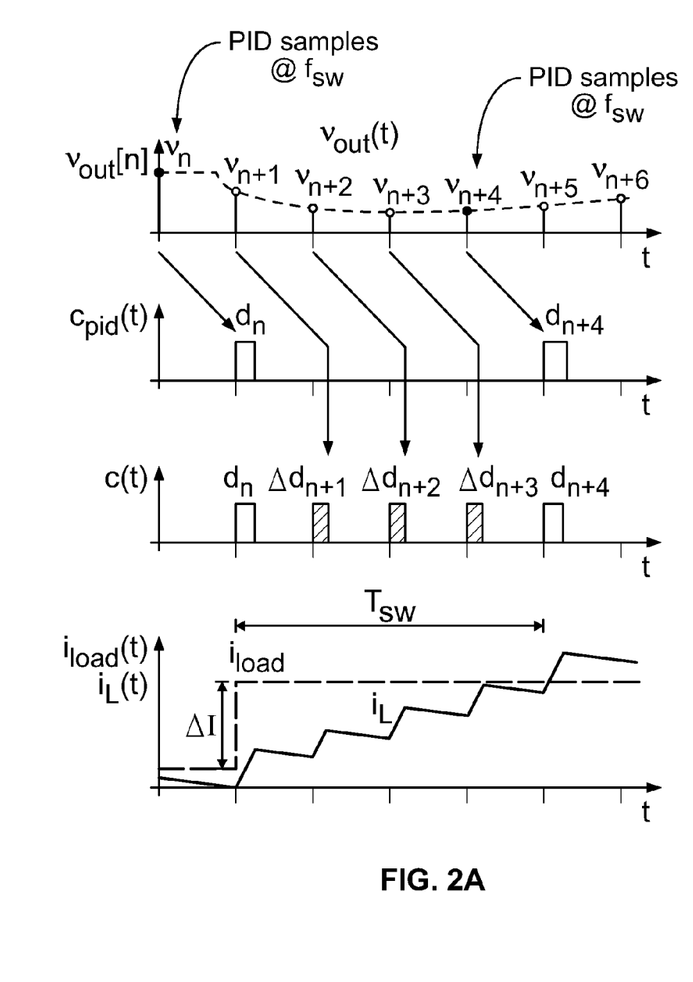
Figure 2B:
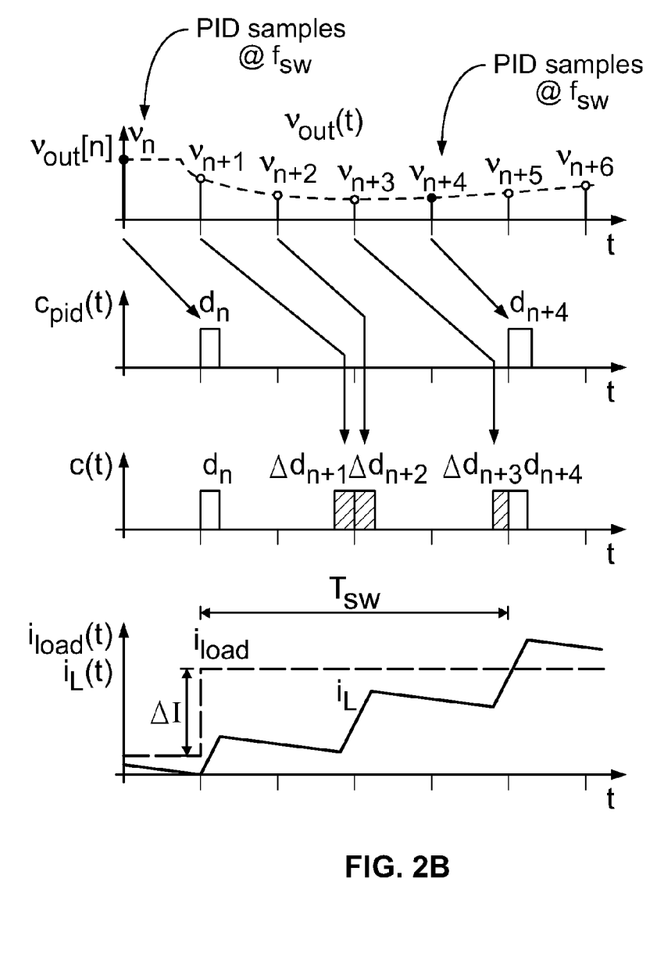

FIGS. 1 and 2 A-B illustrate how the control pulses in this controller are generated. To minimize the delays existing in once-per-cycle sampled systems, the oversampling controller usually takes more samples per switching cycle. For example, the system of FIG. 1 takes four samples of the output voltage errors signal e[n] during each switching cycle.

Those samples are processed by two functional blocks. The first block 104 consists of Programmable Differentiator 110 and a Transient Current Estimator 112. Block 104 is active during transients only, to improve dynamic response. It takes all four error samples and, as shown in FIG. 2A, during output voltage deviations, produces Δd[n] values, corresponding to increase of the duty ratio control variable d[n].

The second block is a PID compensator 106 that takes only one sample per cycle and produces a duty ratio control signal d[n] that keeps system stable in steady-state conditions.

Figure 3:
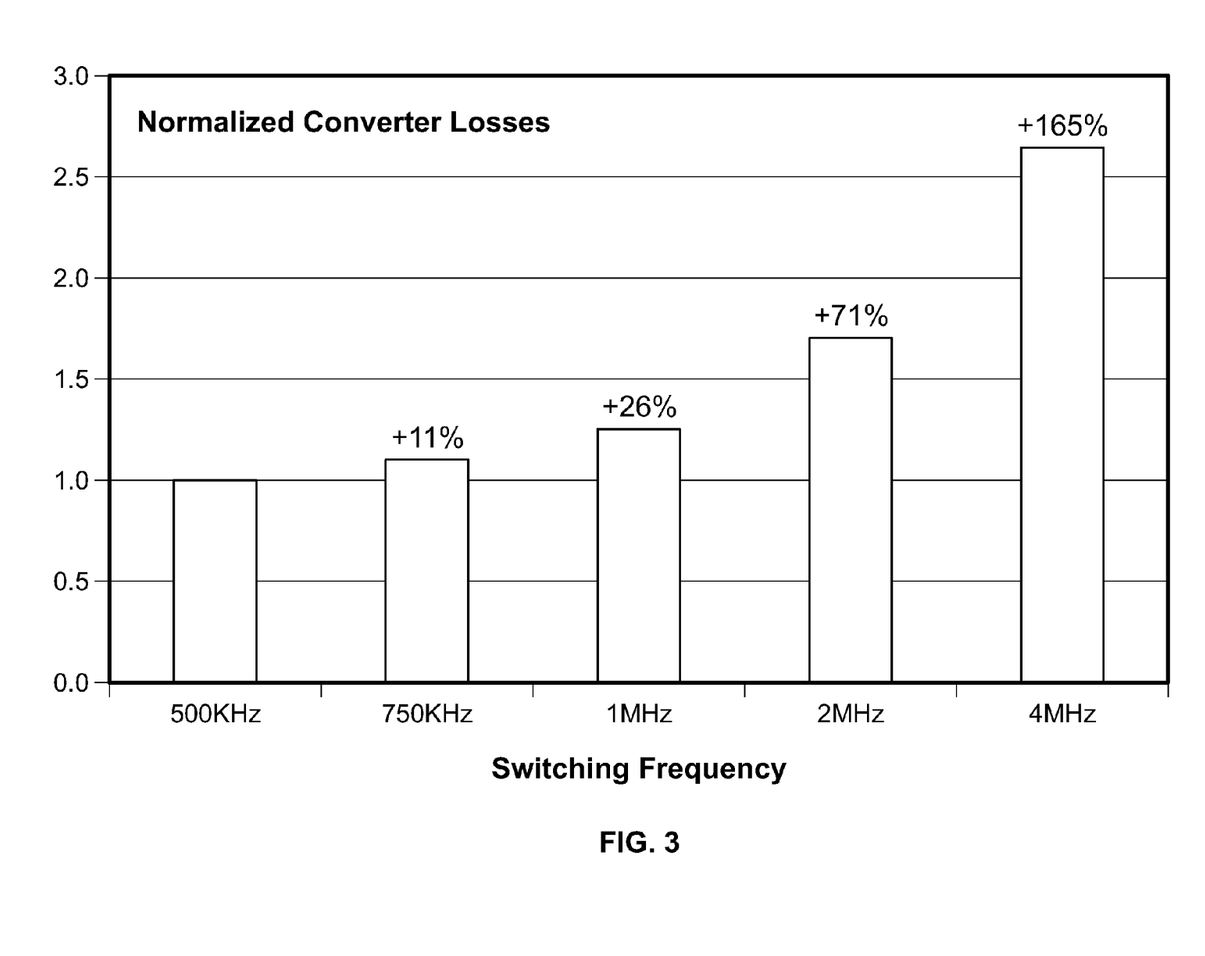
FIG. 3 shows normalized converter losses versus the frequency of the switching actions for a typical industrial converter designed to operate at 500 kHz.

Theoretically, during transients, this converter could operate at the oversampling rate during transients to obtain a fast response. However, this implementation is not practical. As it can be seen from FIG. 3, showing the dependence of converter losses on switching frequency for a realistic converter, such an operation would incur additional switching losses and, for highly dynamic loads, significantly reduce the converter power processing efficiency. Another practical problem is related to random quantization effects significantly affecting accuracy of Δd[n] calculations.

To solve for the previously mentioned problems, sequence of FIG. 2A is modified as shown in FIG. 2B. Instead of producing Δd[n] pulses at the sampling rate, they are created every other sample, while the information about the calculated values is taken into account for each sampling cycle. The calculated increments of the two samples are glued together. At the sampling instants where the Δd[n] pulses coincide with those produced by the PID compensator 106, the increments are "glued" to the values produced by the PID regulator. In this way, the switching rate of the system during transient is reduced.

The created pulses are sent to an oversampled digital pulse-width modulator (ODPWM) 108. The ODPWM 108 provides updates of the calculated values at a ½ of the sampling rate, for the implementation shown in FIGS. 2A-B and 3 that is at the twice switching frequency. The ODPWM 108 actively monitors the switching pulses of FIG. 2A, and, accordingly, readjusts their relative position to reduce the effective switching frequency, as shown in FIG. 2B.

To resolve the problem of overly frequent switching actions and, consequently, reduce the power stage switching losses during transients, the ODPWM 108 attaches the oversampled pulses, such that the effect of the oversampling calculations is maximized without a significant increase of switching frequency.

Figure 4:
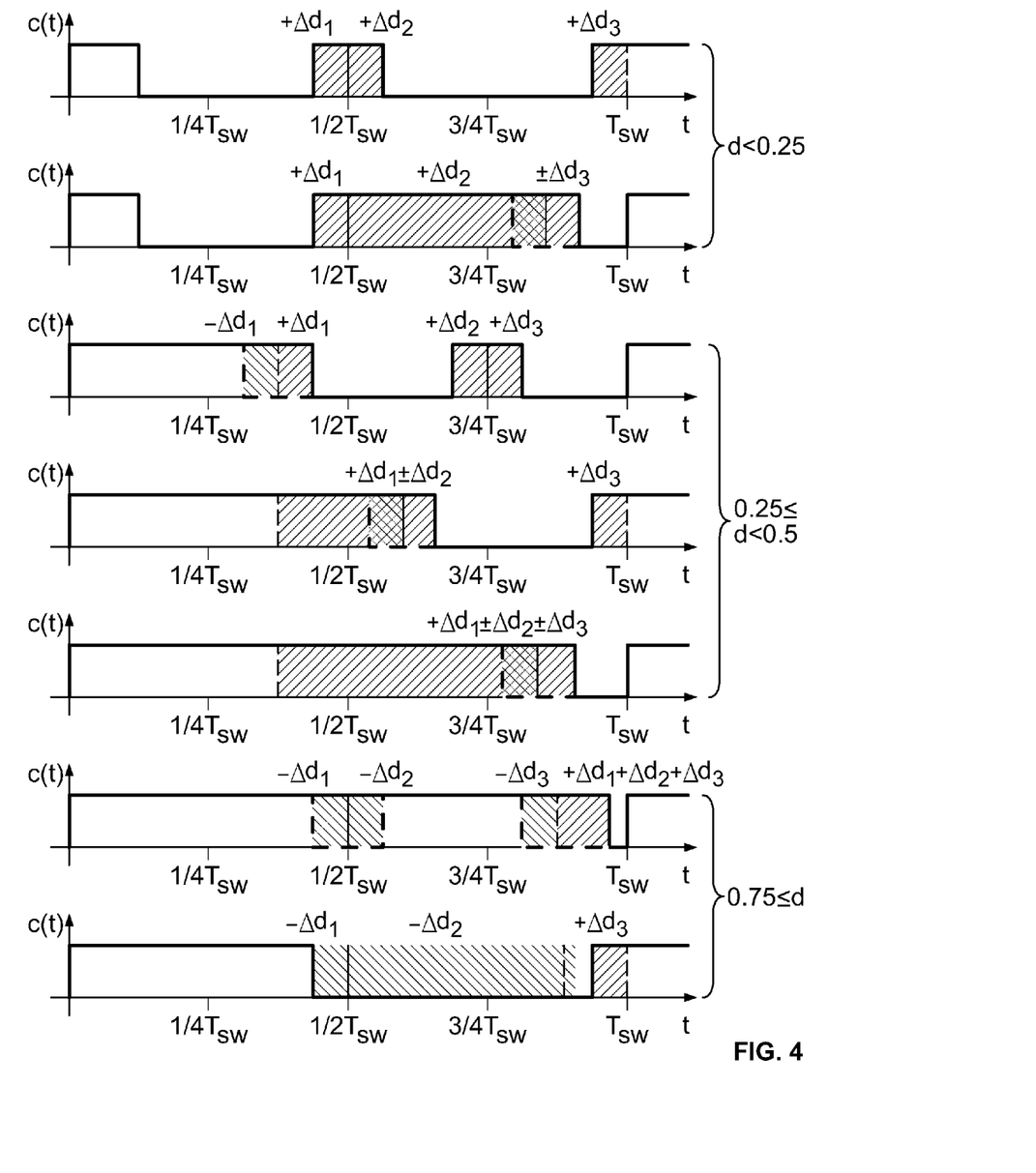
FIG. 4 shows switching waveforms generated by the oversampled digital pulse-width modulator (ODPWM) for different duty ratio values.

The principle of operation is illustrated in FIG. 4 and can be explained through the following example. For PID-calculated duty ratio values less than 0.25, additional pulses $\Delta d_1$ and $\Delta d_2$ are merged at the middle of the switching period while $\Delta d_3$ is appended to the rising edge of the next generated PID pulse. If $\Delta d_1$ and $\Delta d_2$ are significantly large such that they extend beyond $\frac{3}{4}T_{sw}$, $\Delta d_3$ is merged with the falling edge of $\Delta d_2$ in order to reduce the delay of the control action and improve the response. Therefore the effective switching frequency is limited to $2f_{sw}$. A similar approach is used for duty ratios above 0.25. The only difference is that negative oversampled $-\Delta d$ pulses can be now generated by subtracting them from the original pulse. This is beneficial for minimizing the voltage deviation during heavy-to-light load steps. From FIG. 4, it can be observed that the ODPWM 108, while reducing the effective switching frequency, also minimizes the control action delay. This reduction in control delay significantly contributes to the reduction in output voltage deviations during transients.

Different duty cycles have different possible pulse additions or subtractions, but in each case, the highest frequency of the modified PWM is limited to a value below the oversampling frequency.

A possible practical implementation of the ODPWM 500 is shown in FIG. 5. It consists of three main blocks: conventional DPWM 501, pulse-glue generator 502, and pulse add/subtract logic 504. The conventional DPWM 501 generates periodic switching pulses $c_{fsw}(t)$ based on the input duty ratio command d[n], calculated at the beginning of the each switching cycle. The conventional DPWM 501 can be implemented using one of the common DPWM architectures such as counter based, delay line based or hybrid, combining the previous two. This block also provides external clock signals used by the oversampled controller logic. Their frequencies are multiples of the nominal switching frequency $f_{sw}$.

During output voltage transient, pulse updates $\pm\Delta d$ are glued to the original pulse $c_{fsw}(t)$ generated by the conventional DPWM 501, such that the switching activity of the final control signal c(t) is minimized. This is performed by the pulse-glue generator and pulse add/subtract logic that produce oversampled pulse $c_{os}(t)$. The operation of the pulse-glue generator 502 is synchronized to the conventional DPWM 501 based on the information provided by the carrier signal that flags the beginning and the end of the regular switching cycle of $c_{fsw}(t)$ and initial duty ratio value d[n].

Figure 6A:
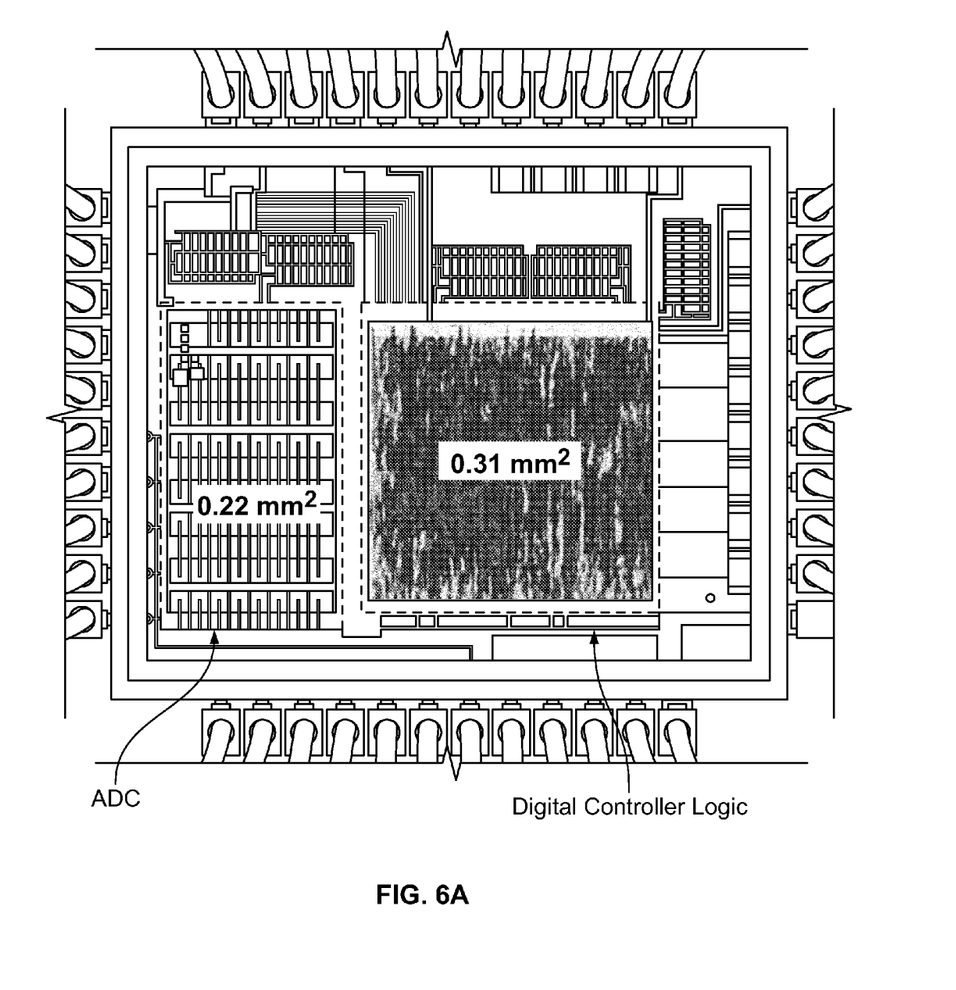

To prove the practicality of the presented invention, controller architecture from FIG. 1 is fabricated on-chip, in CMOS 0.18 μm technology, and the chip die is shown in FIG. 6A. A summary of the key IC parameters is provided in Table I. It can be seen that the IC occupies very small silicon area making it practical for numerous cost-sensitive applications.

Figure 6B:
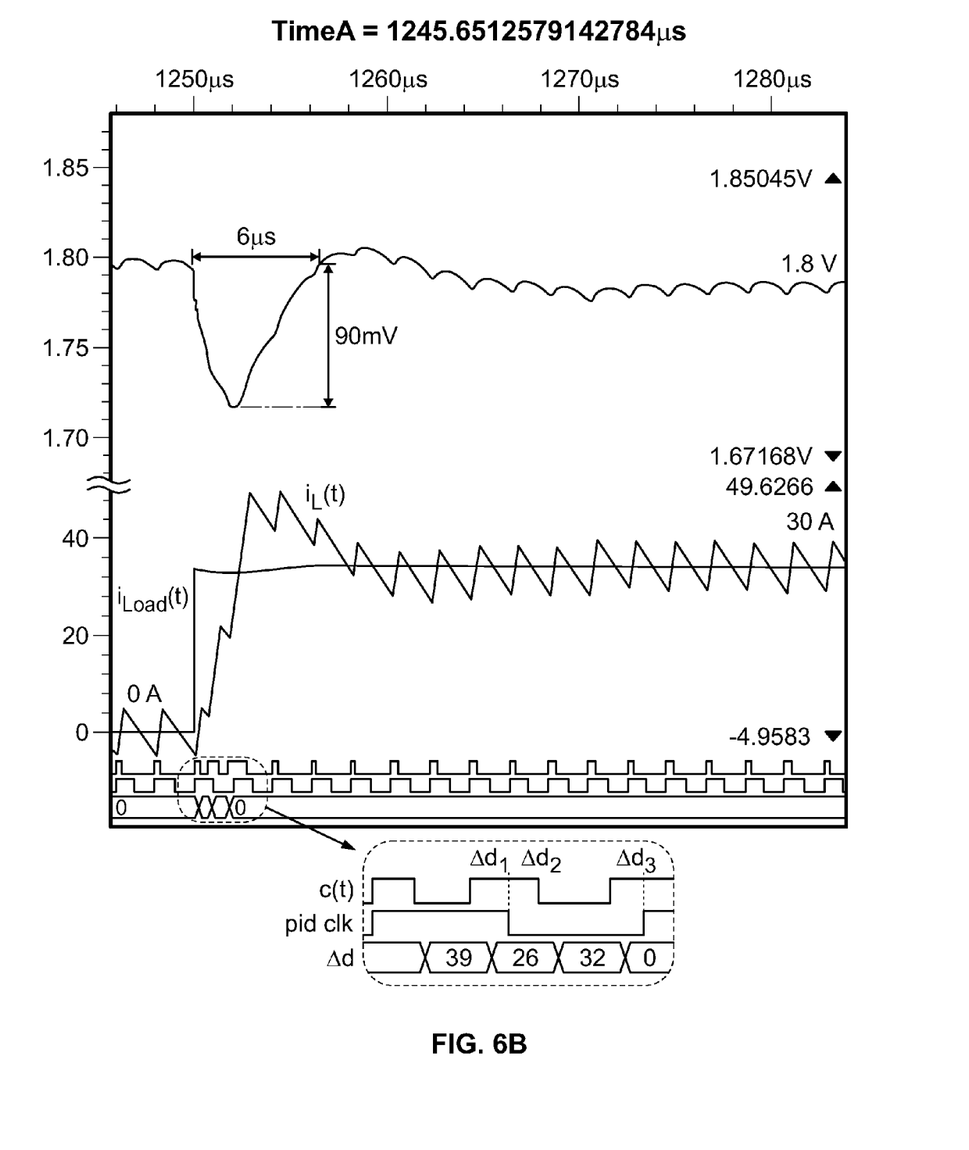
FIG. 6B shows a mixed-signal simulation for a load step of 30 A with a buck converter switching at 500 KHz and having inductor and capacitor values of L=325 nH and C=600 µF.

The controller occupies 0.53 mm² of active silicon area. The digital portion of the controller is implemented in Verilog HDL and after synthesis it consists of 5500 logic gates. The operation of the controller is verified with a mixed-signal simulation. For a 30-A light-to-heavy load step, the results are shown in FIG. 6B where a 90 mV output voltage deviation and 6 μs settling time are observed. As it can be seen in FIG. 6B, to minimize switching activity and improve efficiency, the additional pulses are effectively "glued" while they are produced only until the voltage deviation is suppressed.

TABLE I

Oversampling Controller Chip Summary

| | |
|---|---|
| Technology | TSMC 0.18 μm CMOS |
| Supply voltage | 1.8 V/3.3 V |
| ODPWM resolution | 8 bits |
| ODPWM nominal frequency | 500 KHz |
| ADC resolution | 4 mV |
| ADC sampling frequency | 2 MHz |

TABLE I-continued

Oversampling Controller Chip Summary

| | |
|---|---|
| ADC conversion time | 300 ns |
| Controller complexity | 5500 gates |
| Controller area (digital part) | 0.31 mm$^2$ |
| ADC area | 0.22 mm$^2$ |
| Total active chip area | 0.53 mm$^2$ |

An experimental system verifying the operation of the oversampled controller IC was built based on the diagram shown in FIG. 1. The power stage is a 60-W, 12-V-to-1.8-V buck converter switching at 500 KHz. The inductor value L is 325 nH and the output capacitor value C is 600 μF. The on-chip ADC has a 4 mV resolution and a 300 ns conversion time. The PID compensator coefficients are externally programmed onto the chip to obtain a bandwidth higher than $1/10^{th}$ of the switching frequency. Initially, controller blocks responsible for the non-linear operation are disabled and controller response is verified.

FIG. 6A shows the obtained response with a load step of 30 A with the PID compensator only. Even though the PID compensator reacts aggressively, increasing the inductor current to a value near the load step in one control action, due to the one cycle delay the voltage deviation is large and equal to 200 mV. The settling time is around 20 μs.

Figure 7A:
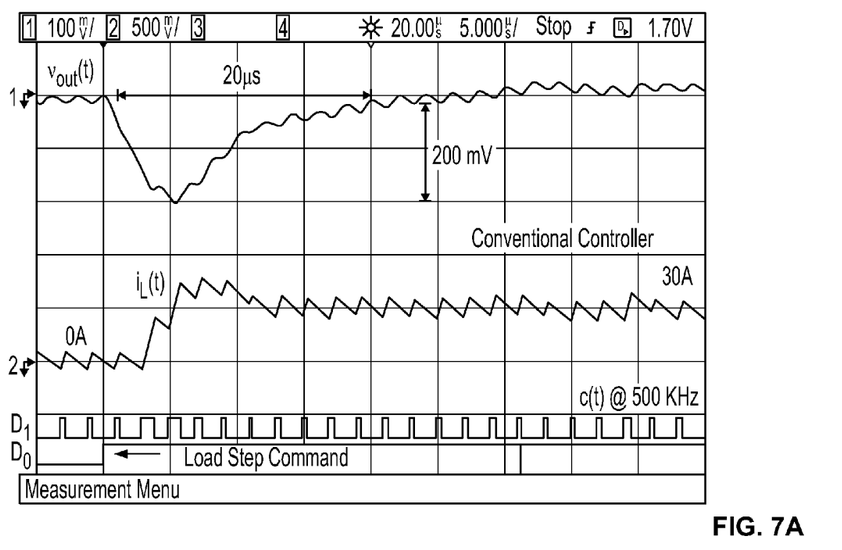
Figure 7B:
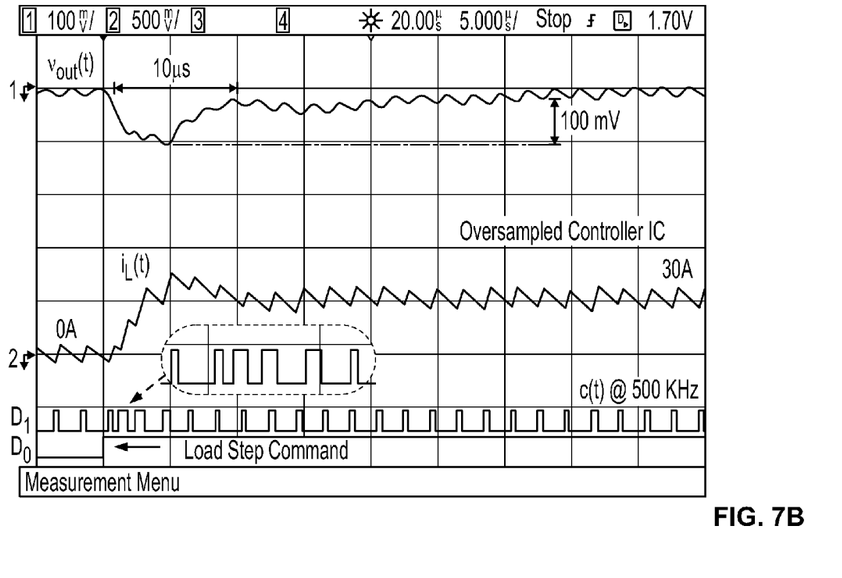
FIG. 7B shows an oversampled controller IC response with channel 1 being output converter voltage (100 mV/div); channel 2 being an actual inductor current $i_L(t)$; D1 being a switching control signal, D0 being a load step command; wherein the time scale is 5 µs/div.

In the next step, the new controller is enabled and the response for the identical load step is observed, as shown in FIG. 7B. In this case, as soon as the load step is detected, by taking three additional samples, Δd pulse values are calculated. To minimize the number of switching actions and improve the converter efficiency, the ODPWM attaches the pulses as described previously. As a result, only one additional switching sequence is added as demonstrated in FIG. 7B. This figure also demonstrates that the additional pulses are injected only until the initial voltage deviation is suppressed, i.e. the inductor current has reached approximately the output load current. Therefore, during most of the settling period and in steady-state the converter switches at the nominal 500 KHz. The obtained voltage deviation is reduced by a factor of two (50%) compared to the PID compensator allowing for the similar reduction in the size of the output capacitor. The settling time is also reduced, to approximately 10 μs.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

The invention claimed is:

1. A digital pulse width modulator (DPWM) producing a pulse width modulation (PWM) output signal at a first frequency during a first period, the DPWM using an over sampled feedback signal sampled at a second frequency greater than the first frequency; wherein during an output voltage deviation period, the DPWM produces a modified PWM signal using the oversampled feedback signal, the modified PWM signal being limited to a third frequency that is between the first and second frequency.

2. The DPWM of claim 1, wherein a pulse glue generator produces a signal to be added or subtracted to the normal PWM signal during output voltage deviations.

3. The DPWM of claim 1, wherein the second frequency is four times the first frequency and the third frequency is two times the first frequency.

4. The DPWM of claim 1, wherein the feedback signal is an error signal.

5. The DPWM of claim 1, further comprising:
a circuit to determine output voltage transients and to enable the modification of the normal PWM signal.

6. The DPWM of claim 1, wherein during an output voltage deviation, the DPWM adds or subtracts extra pulses to the normal PWM signal.

7. The DPWM of claim 6, wherein the extra pulses are arranged such that the PWM output does not exceed the third frequency.

8. A digital pulse width modulator (DPWM) producing a pulse width modulation (PWM) at a first frequency during a first period, the DPWM using an over sampled feedback signal sampled at an oversampling frequency that is greater than the first frequency, wherein during an output voltage deviation period, the DPWM uses the oversampled feedback signal to determine extra pulses to be added or subtracted from the normal PWM signal to produce a modified PWM signal, wherein the extra pulses are such that the frequency of the modified PWM signal is limited to half the oversampling frequency or less.

9. The DPWM of claim 8, wherein a pulse glue generator produces a signal to be added or subtracted to the normal PWM signal during output voltage deviations.

10. The DPWM of claim 8, wherein the oversampling frequency is four times the first frequency and the frequency of the modified PWM signal is two times the first frequency.

11. The DPWM of claim 8, wherein the feedback signal is an error signal.

12. The DPWM of claim 8 further comprising:
a circuit to determine output voltage transients and to enable the modification of the normal PWM signal.

13. A method comprising:
producing a pulse width modulator (PWM) signal at a first frequency during a first period;
oversampling a feedback signal at a second frequency;
using the oversampled feedback signal to determine an output voltage deviation period; and
during the output voltage deviation period, adding or subtracting pulses to the PWM signal to produce a modified PWM signal, the modified PWM signal being limited to a third frequency that is between the first and second frequency.

14. The method of claim 13, wherein a pulse glue generator produces a signal to be added or subtracted to the normal PWM signal during the output voltage deviations.

15. The method of claim 13, wherein the second frequency is four times the first frequency and the third frequency is two times the first frequency.

16. The method of claim 13, wherein the feedback signal is an error signal.

* * * * *